(12) United States Patent
Thompson et al.

(10) Patent No.: US 7,339,267 B2
(45) Date of Patent: Mar. 4, 2008

(54) SEMICONDUCTOR PACKAGE AND METHOD FOR FORMING THE SAME

(75) Inventors: Vasile Romega Thompson, Tempe, AZ (US); Jason Fender, Chandler, AZ (US); Terry K. Daly, Gilbert, AZ (US); Jin-Wook Jang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 93 days.

(21) Appl. No.: 11/140,351

(22) Filed: May 26, 2005

(65) Prior Publication Data

US 2006/0270194 A1 Nov. 30, 2006

(51) Int. Cl.
*H01L 23/10* (2006.01)
(52) U.S. Cl. .................................... 257/707
(58) Field of Classification Search ........... 257/766, 257/698, 706, 707, 774; 438/244, 612, 650, 438/686
See application file for complete search history.

(56) References Cited

U.S. PATENT DOCUMENTS

| | | | | |
|---|---|---|---|---|
| 3,881,884 A | * | 5/1975 | Cook et al. | 216/13 |
| 5,027,189 A | * | 6/1991 | Shannon et al. | 257/783 |
| 5,378,926 A | * | 1/1995 | Chi et al. | 257/767 |
| 5,998,238 A | * | 12/1999 | Kosaki | 438/114 |
| 6,040,239 A | * | 3/2000 | Akram et al. | 438/612 |
| 6,140,703 A | * | 10/2000 | Cronin et al. | 257/766 |
| 6,607,941 B2 | * | 8/2003 | Prabhu et al. | 438/113 |
| 6,960,824 B1 | * | 11/2005 | Hashemi et al. | 257/698 |
| 2004/0023463 A1 | * | 2/2004 | Shirakawa | 438/312 |

OTHER PUBLICATIONS

Fender, J. et al. Development of Backside Process For Use with Solder Paste Die Attach, Apr. 24, 2006 CS Mantech Conference, pp. 209-211.*

* cited by examiner

*Primary Examiner*—Zandra V. Smith
*Assistant Examiner*—Paul E Patton
(74) *Attorney, Agent, or Firm*—Ingrassia, Fisher & Lorenz, P.C.

(57) ABSTRACT

Semiconductor packages (100) that prevent the leaching of gold from back metal layers (118) into the solder (164) and methods for fabricating the same are provided. An exemplary method comprises providing a semiconductor wafer stack (110) including metal pads (112) and a substrate (116). An adhesion/plating layer (115) is formed on the substrate (116). A layer of gold (118) is plated on the adhesion/plating layer (115). The layer of gold is etched in a street area (124) to expose edge portions (128) of the layer of gold (118) and the adhesion/plating layer (115). A layer of barrier metal (130) is deposited to form an edge seal (129) about the exposed edge portions (128). The edge seal (129) prevents the leaching of gold from back metal layers (118) into the solder (162) when the wafer stack (110) is soldered to a leadframe (162).

20 Claims, 2 Drawing Sheets

US 7,339,267 B2

SEMICONDUCTOR PACKAGE AND METHOD FOR FORMING THE SAME

FIELD OF THE INVENTION

The present invention generally relates to semiconductor packaging and methods for fabricating semiconductor packages, and more particularly to die attachment processes.

BACKGROUND OF THE INVENTION

After various die have been created on a wafer, they must undergo die preparation, during which the die is prepared for integrated circuit (IC) packaging and testing. The die preparation process typically consists of wafer mounting and die cutting, followed by a die attachment step. The die is attached to a die pad or die cavity of a support structure (e.g. the leadframe) of a semiconductor package. The way the die is bonded defines the die attachment process. Soft solder and solder paste, applications are typically used in automotive and high-power devices. As an example, during a soft solder or solder paste attachment process, a solder material is used to bond the die to the leadframe. During a soft solder attachment process, solder is introduced as a wire preform and melted onto the hot leadframe surface as a liquid solder dot. During a solder paste attachment process, solder is dispensed on the leadframe through a small syringe. The die is then placed onto the solder, heated above melting point then cooled providing a solid connection.

Current back-end metal processes include depositing a layer of gold and a barrier material on the wafer prior to dicing or singulation. The classic wafer dicing approach employs saw blades to cut straight lines through device arrays, resulting in an exposed gold layer at the singulation cut point. During the soft solder attachment process, the exposed portion of the gold layer is dissolved into the solder resulting in loss of adhesion and the formation of large voids within the solder bulk. A typical gold loss is 30% due to gold dissolution or leaching into the solder.

Accordingly, it is desirable to provide a method for packaging semiconductor devices that results in reduced solder voiding and improved adhesion of the semiconductor die. In addition, it is desirable to provide a method for packaging semiconductor devices that provides a device with improved thermal performance. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
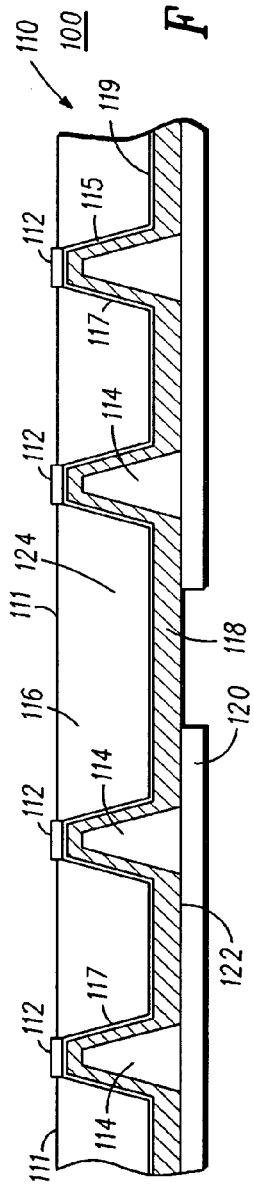
FIGS. 1-6 illustrate in cross section, a semiconductor wafer package and method steps for its manufacture, both in accordance with the present invention.

FIGS. 1-6 illustrate in cross section, a semiconductor wafer package and method steps for its manufacture in accordance with the present invention. As illustrated in FIG. 1, the manufacture of semiconductor package 100 in accordance with an embodiment of the invention begins with providing a substrate 116, typically a semiconductor wafer, having a plurality of metal pads 112 formed on an uppermost surface 111 fabricated according to well known semiconductor fabrication techniques. A plurality of thermal vias 114 are provided in alignment with pads 112 and provide for the transfer of heat and increased source to drain current generated by associated semiconductor devices (not shown) to a package substrate (discussed below). Substrate 116 is preferably comprised of gallium arsenide (GaAs) wherein the term "substrate" is used herein to encompass the substrate itself together with metal or insulator layers that may overly the substrate to form semiconductor wafer stack 110. It should be understood that various steps in the manufacture of wafer stack 110 and more particularly in the manufacture of pads 112 and thermal vias 114 are well known and so, in the interest of brevity, many conventional steps will only be mentioned briefly herein or will be omitted entirely without providing the well-known process details.

During the wafer fabrication process, an adhesion/conducting layer 115 is formed on a back surface 119 of substrate 116. Layer 115 is formed of a layer of titanium having a thickness in a range of 1000-2000 Å, and a layer of gold having a thickness in a range of 4000-6000 Å. Layer 115 is deposited on substrate 116 by standard sputtering processes well known in the art and provides for increased thermal properties and plating of a subsequent layer.

Next, a layer 118 of gold is plated on a surface of adhesion/conducting layer 115. Layer 118 of gold is formed approximately 3 microns thick in this exemplary embodiment and is deposited on adhesion/conducting layer 115 by standard plating processes well known in the art. Layer 118 of gold provides a thermal path and increases the source to drain current capability of devices in contact with metal pads 112, rendering metal pads 112 more efficient.

Subsequent to the plating of layer 118, a layer 120 of photoresist is applied to a surface 122 of layer 118 of gold and is photolithographically patterned as illustrated in FIG. 1. Patterning of layer 120 is performed using standard photolithography steps well known in the art and exposes layer 118 of gold in a street or scribe area 124 of wafer stack 110. Subsequent dicing or singulation of wafer stack 110 will take place in street area 124.

Figure 2:
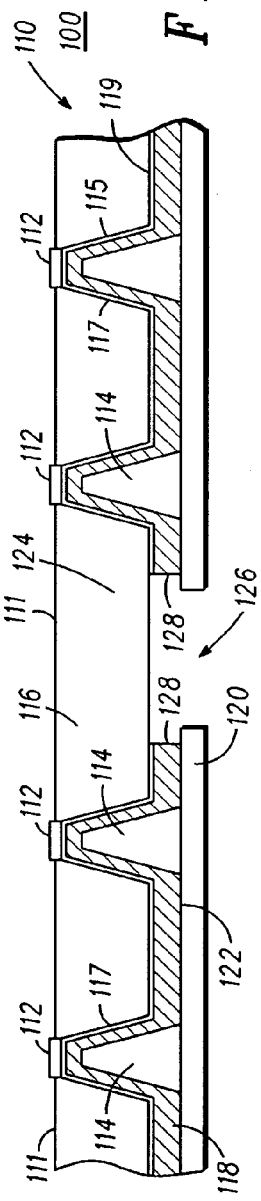
Figure 3:
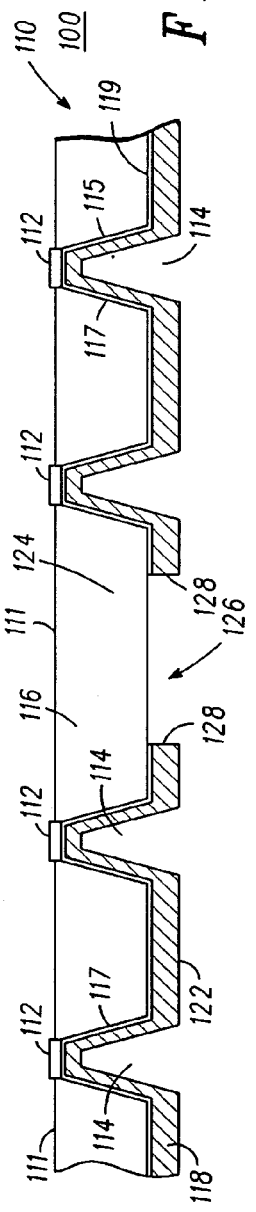

FIG. 2 illustrates the use of patterned photoresist layer 120 as an etch mask to etch through layer 118 of gold. Etching of layer 118 of gold provides a trench 126 in layer 118 and exposes edge portions 128 of layer 118 of gold and adhesion/plating layer 115, and a portion of substrate 116. Layer 118 of gold is etched by using well known wet chemistry such as X20. Layer 120 of photoresist is removed after completing the etching of trench 126 as seen in FIG. 3.

Figure 4:
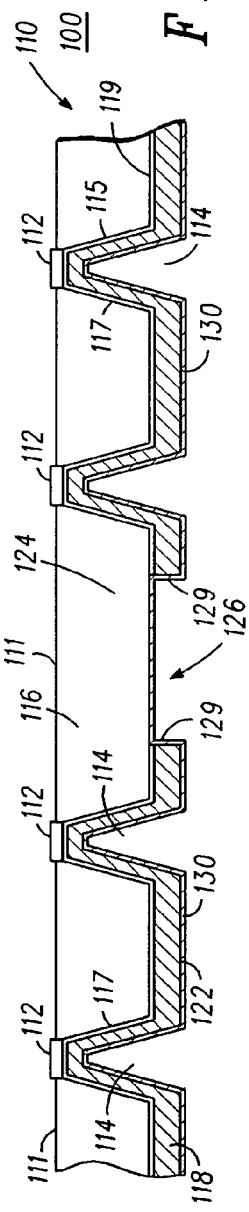

After photoresist layer 120 is stripped away, a layer 130 of barrier metal is deposited on surface 122 of layer 118 of gold as illustrated in FIG. 4. Layer 130 of barrier metal is deposited by sputtering techniques over surface 122 of wafer stack 110 and into trench 126 and thermal vias 114. In one embodiment, layer 130 of barrier metal is comprised of titanium, nickel-vanadium, and gold. In a preferred embodiment, layer 130 of barrier metal comprises a titanium material having a thickness of approximately 0.3 microns, a nickel-vanadium (7-9 wt % vanadium) material having a thickness of approximately 0.6 microns, and a gold material having a thickness of approximately 0.5 microns. In general, layer 130 of barrier metal is formed having a thickness in a range of approximately 1.0 microns to 1.7 microns. Layer 130 of barrier metal is deposited so that the titanium material is formed on surface 122 of layer 118 of gold, having the nickel-vanadium material sandwiched between the titanium and gold material, that together comprise layer 130 of barrier metal. The ratio of the layer of gold in layer 130 of barrier metal is less than layer 118 of gold that it will ultimately provide and edge seal for. Layer 130 provides an edge seal 129 formed about edge portions 128 of layer 118 of gold and adhesion/plating layer 115. Edge seal 129 will prevent the leaching of layer 118 into a solder material (described below) during the die attachment process.

Figure 5:
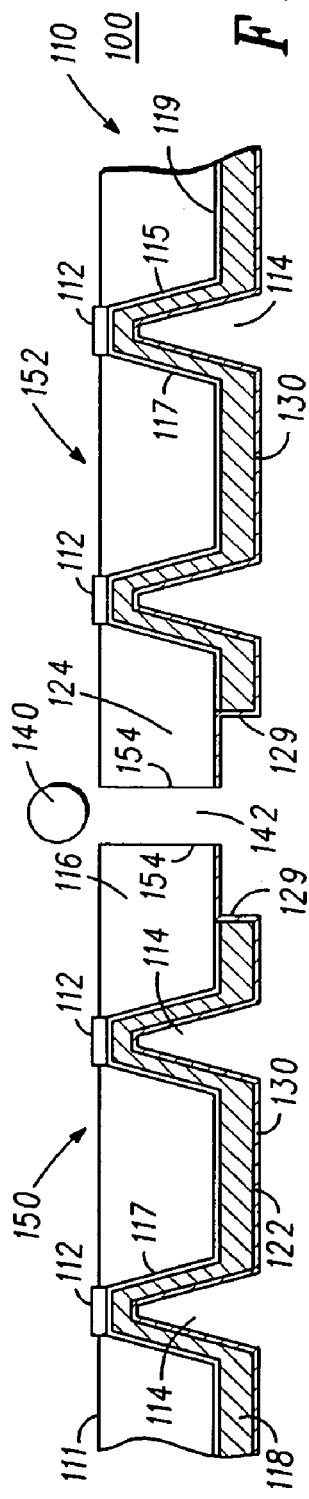

Referring now to FIG. 5, subsequent to deposition of layer 130 of barrier metal, wafer stack 110 undergoes die preparation during which wafer stack 110 is singulated into individual die in preparation for assembly. Die preparation typically consists of two major steps performed prior to die attachment, namely, wafer mounting and wafer sawing. Wafer mounting comprises providing support to the wafer to facilitate the processing of the wafer from wafer sawing through the die attachment process. During wafer mounting, wafer stack 110 and a wafer frame (not shown) are simultaneously attached on a support wafer or dicing tape.

Wafer sawing follows wafer mounting and comprises cutting the wafer into individual die for assembly in IC packages. Referring to FIG. 5, a wafer saw 140 is used to make a cut 142 through wafer stack 110 in street area 124. The process of wafer sawing results in a first wafer portion, or die, 150 and a second wafer portion, or die, 152. Next, wafer portions 150 and 152 undergo a cleaning process (not shown) prior to die attachment.

Wafer sawing provides an exposed edge 154 on each wafer portion 150 and 152. As illustrated in FIG. 5, the previous deposition of layer 130 of barrier metal provides sealing of layer 118 of gold by edge seal 129 subsequent to dicing. This sealing of layer 118 eliminates the loss of gold and the forming of voids in the solder during the die attachment process in that layer 130 of barrier metal is chemically non-responsive to the solder during the attachment process.

Figure 6:
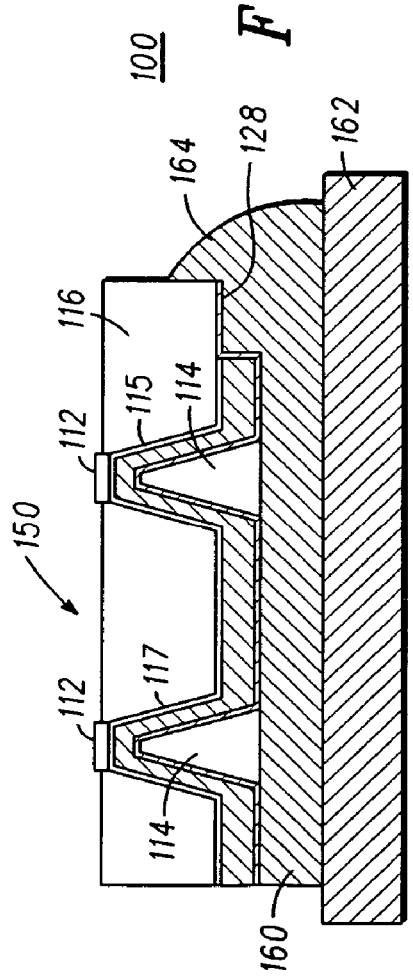

FIG. 6 illustrates a complete wafer package including first wafer portion 150 subsequent to die attachment. After dicing, first wafer portion 150 undergoes die attachment to form a semiconductor package. The die attachment process is also known as die mounting or die bonding. During the process, the wafer or die, is attached to the die pad or die cavity of the support structure (e.g., the leadframe) of the semiconductor package. Typically the die attachment process uses well known die attachment equipment and die attachment tools to mount the die.

As illustrated, a solder material 160 is utilized to bond first wafer portion 150 to a leadframe 162. Leadframe 162 may be a copper plated leadframe formed of, for example, nickel, palladium and gold. In a soft solder process, solder material 160 is introduced as a wire preform and melted onto the surface of hot leadframe 162 as a liquid solder dot. First wafer portion 150 is then placed on the hot solder and after cooling, forms a solid connection. During the positioning of wafer portion 150 on the liquid solder dot, the solder dot spreads so as to come in contact with substantially the entire bonding surfaces of wafer portion 150 and leadframe 162. A die attachment fillet 164 is formed where the solder rises up along the edge of wafer portion 150. Solder material 160 is a lead-and-tin-based alloy, and without the inclusion of layer 130 of barrier metal to protect layer 118 of gold, leaching of gold into solder material 160 would occur. As previously stated, however, barrier metal 118 is chemically non-responsive to solder material 160 and therefore no leaching or formation of voids occurs within solder material 160. The soldering of first wafer portion 150 to leadframe 162 is performed in a controlled temperature environment that includes a protective gas atmosphere, such as in an inert gas atmosphere, to prevent oxidation of leadframe 162.

Alternative ways of attaching first wafer portion 150 to leadframe 162 are considered to be within the scope of this invention and include, but are not limited to, solder paste die attachment and wire feed die attachment. The additional photolithography step to form exposed portions 128 of layer 118 during the back metal process, and the deposition of barrier layer 130 to form edge seals 129 provides sealing of layer 118 of gold thereby maintaining the integrity of the back metal during the die attachment process.

Accordingly, provided is a method of fabricating a semiconductor package, the method comprising: providing a semiconductor wafer stack including a plurality of metal pads formed on a first surface of a substrate, and a layer of gold formed on an opposite second surface of said substrate; etching said layer of gold in a street area of said semiconductor wafer stack, wherein the etching exposes a plurality of edge portions of said layer of gold and said substrate; forming an edge seal about said exposed edge portions of said layer of gold; dicing said semiconductor stack in said street area to define a semiconductor die; and attaching said semiconductor die to a support structure. The support structure can be a leadframe. The step of providing a layer of gold comprises the step of depositing by sputtering a layer of gold on the opposite second surface of the substrate. The step of etching includes etching using wet chemistry. The step of forming an edge seal comprises depositing a layer of barrier metal on said opposed second surface wherein the barrier metal has a thickness in a range of 1.0 to 1.7 microns. The step of depositing a layer of barrier metal comprises sputtering individual layers of titanium, nickel-vanadium (7-9 wt % vanadium), and gold. The edge seal prevents the formation of voids in a solder material used during the attaching of said semiconductor die to a support structure.

Further provided is a method of fabricating a semiconductor package, the method comprising: providing a semiconductor stack having a plurality of metal pads formed on a first surface of a substrate and a plurality of thermal vias formed in alignment with the plurality of semiconductor devices; depositing a layer of gold on an opposite second surface of the substrate and extending into the thermal vias; etching the layer of gold in a street area of the semiconductor stack to expose edges of the layer of gold and the substrate; forming an edge seal about the exposed edge portions of the layer of gold with a layer of barrier metal; dicing the semiconductor stack in the street area; and soldering the semiconductor stack to a support structure to form the semiconductor package. The support structure can be a leadframe structure. The step of etching includes etching using wet chemistry. The step of forming an edge seal comprises the step of sputtering the layer of barrier metal having a thickness in a range of 1.0-1.7 microns, wherein the barrier metal comprises layers of titanium, nickel-vanadium (7-9 wt % vanadium), and gold. The edge seal prevents leaching of the layer of gold into a solder material used during the soldering process and the formation of voids in the solder material.

Finally, provided is a semiconductor package comprising: a semiconductor die comprising: a substrate; at least one semiconductor device formed on a first surface of the substrate; a layer of gold formed on a second surface opposite to the first surface of the substrate and having an edge portion; a layer of barrier metal formed on a surface of the layer of gold, wherein the layer of barrier metal creates and edge seal about the edge portion of the layer of gold; and a support structure soldered to the semiconductor die. The edge seal prevents the leaching of the layer of gold into the solder material. The substrate can be gallium arsenide. The exposed edge portions of the layer of gold are formed during an etch step in a street area of the semiconductor die. The layer of barrier metal is comprised of layers of titanium, nickel-vanadium (7-9 wt % vanadium), and gold. The package further includes a plurality of thermal vias formed in the substrate.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor package, the method comprising:
   providing a semiconductor wafer stack including a plurality of metal pads formed within a first surface of a substrate, an adhesion/plating layer formed on an opposite second surface of said substrate, and a layer of gold formed on a surface of said adhesion/plating layer;
   etching said layer of gold in a street area of said semiconductor wafer stack, wherein the etching exposes a plurality of edge portions of said layer of gold, said adhesion/plating layer, and said substrate;
   forming an edge seal about said exposed edge portions of said adhesion/plating layer and said layer of gold;
   dicing said semiconductor stack in said street area to define a semiconductor die; and
   attaching said die to a support structure.

2. A method of fabricating a semiconductor package as claimed in claim 1, wherein the step of forming an edge seal comprises depositing a layer of barrier metal on said opposite second surface.

3. A method of fabricating a semiconductor package as claimed in claim 2, wherein the step of depositing a layer of barrier metal comprises sputtering a layer of barrier metal comprised of layers of titanium, nickel-vanadium, and gold, and wherein the gold in the layer of barrier metal has a ratio less than the layer of gold formed on a surface of said adhesion/plating layer.

4. A method of fabricating a semiconductor package as claimed in claim 2, wherein the layer of barrier metal has a thickness in a range of 1.0 to 1.7 microns.

5. A method of fabricating a semiconductor package as claimed in claim 1, wherein the support structure is a leadframe.

6. A method of fabricating a semiconductor package as claimed in claim 1, wherein the step of providing a layer of gold comprises the step of depositing by sputtering a layer of gold on the adhesion/plating layer.

7. A method of fabricating a semiconductor package as claimed in claim 1, wherein the step of etching includes etching using wet chemistry.

8. A method of fabricating a semiconductor package as claimed in claim 1, wherein the edge seal prevents the formation of voids in a solder material used during the attaching of said die to a support structure.

9. A method of fabricating a semiconductor package, the method comprising:
   providing a semiconductor stack having a plurality of metal pads formed within a first surface of a substrate and a plurality of thermal vias formed in alignment with the plurality of metal pads;
   depositing an adhesion/plating layer on an opposite second surface of the substrate and extending into the thermal vias;
   depositing a layer of gold on the adhesion/plating layer and extending into the thermal vias;
   etching the layer of gold in a street area of the semiconductor stack to expose edges of the layer of gold, the adhesion/plating layer, and the substrate;
   forming an edge seal about the exposed edge portions of the layer of gold and the adhesion/plating layer with a layer of barrier metal; dicing the semiconductor stack in the street area; and
   soldering the semiconductor stack to a support structure to form the semiconductor package.

10. A method of fabricating a semiconductor package as claimed in claim 9, wherein the step of etching includes etching using wet chemistry.

11. A method of fabricating a semiconductor package as claimed in claim 9, wherein the step of forming an edge seal comprises depositing a layer of barrier metal by sputtering, the layer of barrier metal having a thickness in a range of 1.0 to 1.7 microns.

12. A method of fabricating a semiconductor package as claimed in claim 9, wherein the layer of barrier metal comprises layers of titanium, nickel-vanadium, and gold.

13. A method of fabricating a semiconductor package as claimed in claim 9, wherein the edge seal prevents leaching of the layer of gold into a solder material used during the soldering process and the formation of voids in the solder material.

14. A method of fabricating a semiconductor package as claimed in claim 9, wherein the support structure is a leadframe.

15. A semiconductor package comprising:
   a semiconductor die comprising:
     a substrate having an exposed substrate edge;
     at least one metal pad formed within a first surface of the substrate;
     an adhesion/plating layer formed on a second surface having an edge portion;
     a layer of gold formed on the adhesion/plating layer and having an edge portion;
     a layer of barrier metal formed on a surface of the layer of gold, wherein the layer of barrier metal creates and edge seal about the edge portion of the layer of gold and the edge portion of the adhesion/plating layer, the layer of barrier metal extending to the exposed substrate edge and cooperating therewith to form a substantially planar surface; and
   a support structure soldered to the semiconductor die.

16. A semiconductor package as claimed in claim 15, wherein the substrate the exposed substrate edge is longitudinally spaced apart from the edge seal.

17. A semiconductor package as claimed in claim 15, wherein the support structure is soldered to the semiconductor die with solder material, and wherein the edge seal prevents the leaching of the layer of gold into the solder material.

18. A semiconductor package as claimed in claim 15, wherein the edge portions of the layer of gold and the adhesion/plating layer are formed during an etch step in a street area of the semiconductor die.

19. A semiconductor package as claimed in claim 15, wherein the layer of barrier metal is comprised of layers of titanium, nickel-vanadium, and gold, the layer of barrier metal having a thickness in a range of 1.0 to 1.7 microns.

20. A semiconductor package as claimed in claim 15, further including a plurality of thermal vias formed in the substrate.

* * * * *